United States Patent
Li et al.

(10) Patent No.: US 11,264,946 B2
(45) Date of Patent: Mar. 1, 2022

(54) LOW-PRESSURE CHIP PACKAGING TYPE JUNCTION BOX AND PROCESSING METHOD THEREOF FOR SOLAR POWER GENERATION ASSEMBLY

(71) Applicant: JIANGSU TONGLIN ELECTRIC CO., LTD, Jiangsu (CN)

(72) Inventors: Qianjin Li, Jiangsu (CN); Dibao Zhu, Jiangsu (CN); Daoyuan Zhang, Jiangsu (CN); Liwang Jiang, Jiangsu (CN)

(73) Assignee: JIANGSU TONGLIN ELECTRIC CO., LTD, Jiangsu (CN)

( * ) Notice: Subject to any disclaimer, the term of this patent is extended or adjusted under 35 U.S.C. 154(b) by 28 days.

(21) Appl. No.: 16/492,182

(22) PCT Filed: Dec. 6, 2017

(86) PCT No.: PCT/CN2017/114777
§ 371 (c)(1),
(2) Date: Sep. 9, 2019

(87) PCT Pub. No.: WO2018/161661
PCT Pub. Date: Sep. 13, 2018

(65) Prior Publication Data
US 2021/0143775 A1    May 13, 2021

(30) Foreign Application Priority Data
Mar. 10, 2017   (CN) .......................... 201710142905.6

(51) Int. Cl.
*H02S 40/34*    (2014.01)
*H01L 31/02*    (2006.01)
(Continued)

(52) U.S. Cl.
CPC .......... *H02S 40/34* (2014.12); *H01L 31/0201* (2013.01); *H01L 31/052* (2013.01); *H01L 31/18* (2013.01)

(58) Field of Classification Search
None
See application file for complete search history.

(56) References Cited

U.S. PATENT DOCUMENTS

| 2002/0117200 | A1* | 8/2002 | Yoshikawa | ........... | H01L 31/048 136/256 |
| 2003/0193322 | A1* | 10/2003 | Higashikozono | ..... | H02S 40/345 323/299 |

(Continued)

FOREIGN PATENT DOCUMENTS

| CN | 202601673 U | 12/2012 |
| CN | 104579158 A | 4/2015 |

(Continued)

OTHER PUBLICATIONS

International Search Report dated Mar. 12, 2018 for PCT/CN2017/114777.

*Primary Examiner* — Eli S Mekhlin
(74) *Attorney, Agent, or Firm* — Schmeiser, Olsen & Watts, LLP

(57) ABSTRACT

Provided is a low-pressure chip packaging type junction box for a solar power generation assembly and a processing method thereof, and more particularly, relates to a low-pressure chip packaging type junction box for a solar power generation assembly integrating techniques relating to development and manufacturing of junction boxes with semiconductor packaging techniques to increase a degree of product automation and a processing method thereof. The low-pressure chip packaging type junction box for a solar power generation assembly comprises a box body, N chips, N connection members, and N+1 copper conductors, where (Continued)

N≥1. At least one accommodation recess is arranged at the box body. The box body is provided with a transverse bar. Chip installation positions are arranged at N copper conductors. The N+1 copper conductors are provided with lead-out positions positioned at a top surface of the transverse bar. The chip is welded and fixed to the installation position at the copper conductor.

5 Claims, 13 Drawing Sheets

(51) Int. Cl.
 *H01L 31/052* (2014.01)
 *H01L 31/18* (2006.01)

(56) References Cited

U.S. PATENT DOCUMENTS

| | | | | |
|---|---|---|---|---|
| 2005/0268958 | A1* | 12/2005 | Aoyama | H01L 25/072 |
| | | | | 136/244 |
| 2008/0289682 | A1* | 11/2008 | Adriani | B32B 17/10018 |
| | | | | 136/251 |

FOREIGN PATENT DOCUMENTS

| | | | |
|---|---|---|---|
| CN | 106685342 | A | 5/2017 |
| CN | 206506491 | U | 9/2017 |
| EP | 2256819 | A1 | 12/2010 |

\* cited by examiner

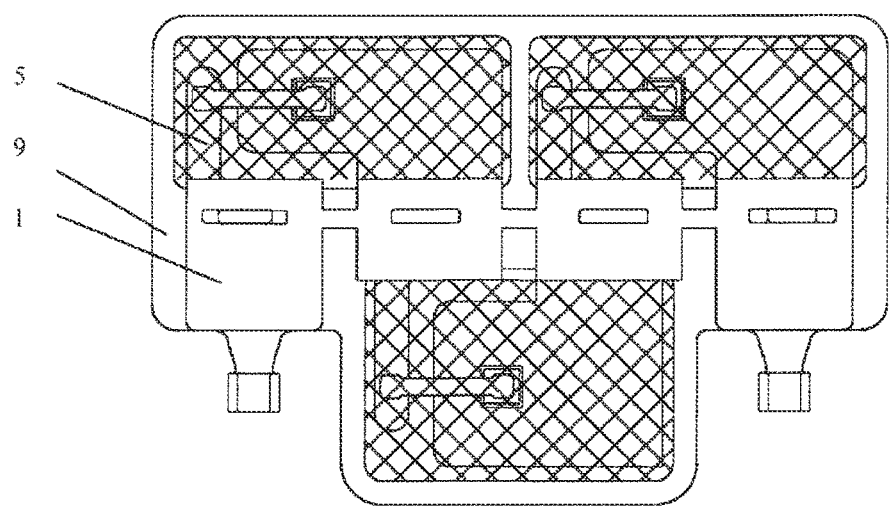
Fig. 1
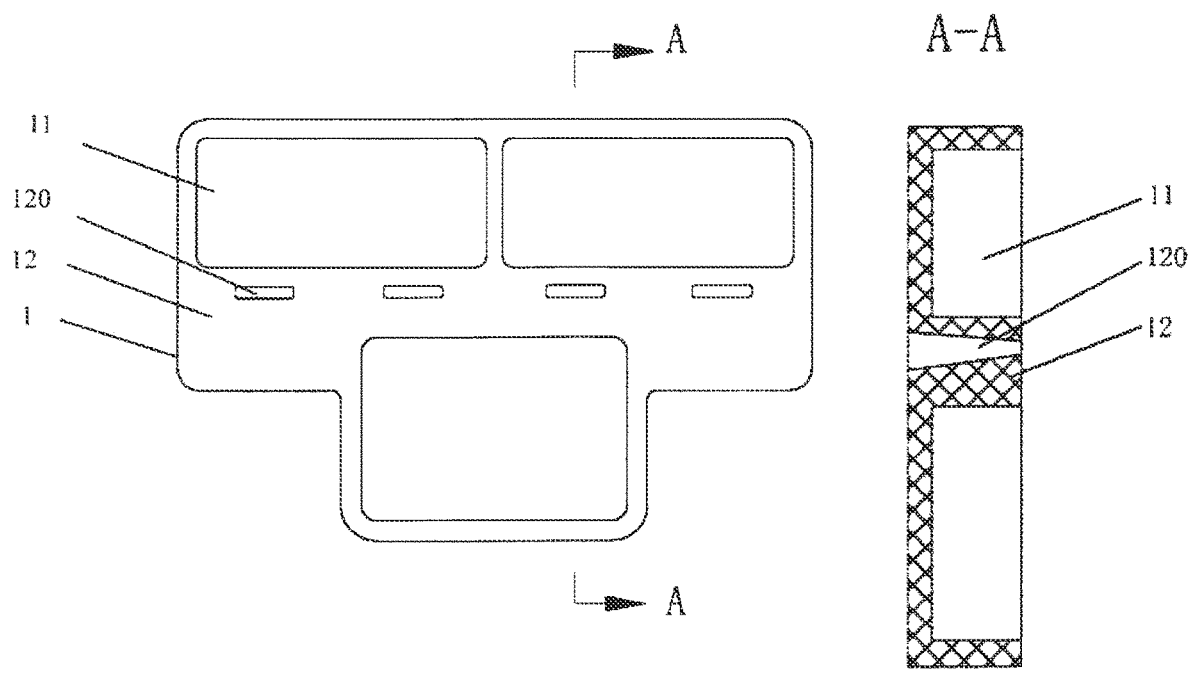
Fig. 2
Fig. 3

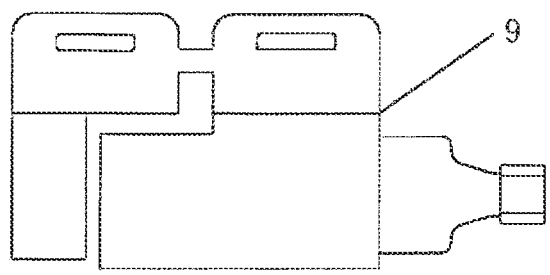
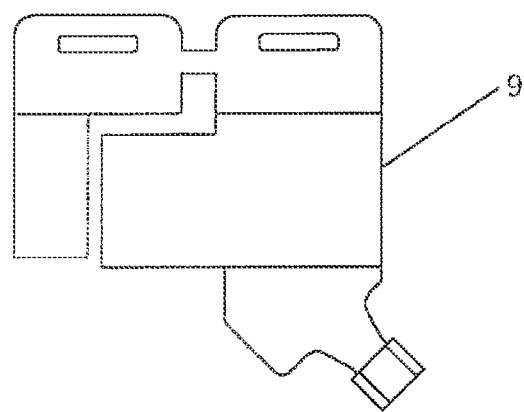
Fig. 32     Fig. 33
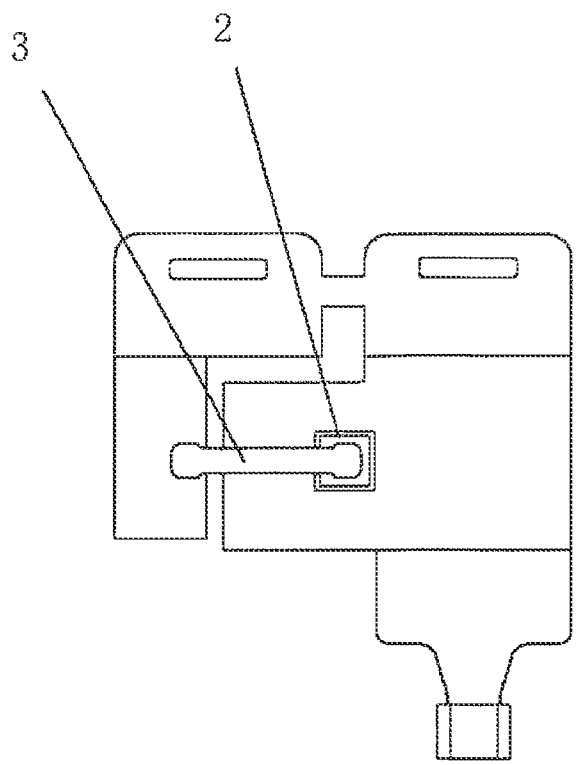
Fig. 34

LOW-PRESSURE CHIP PACKAGING TYPE JUNCTION BOX AND PROCESSING METHOD THEREOF FOR SOLAR POWER GENERATION ASSEMBLY

CROSS-REFERENCE TO RELATED APPLICATIONS

This application claims priority to PCT Application No. PCT/CN2017/114777, having a filing date of Dec. 6, 2017, which is based on CN Application No. 201710142905.6, having a filing date of Mar. 10, 2017, the entire contents both of which are hereby incorporated by reference.

FIELD OF TECHNOLOGY

The following relates to a junction box for a solar power generation assembly, particularly to a low-pressure chip packaging type junction box for a solar power generation assembly and a processing method thereof.

BACKGROUND

A junction box for a solar power generation assembly is an important component installed in a solar power generation assembly. It plays a role in providing bypass protection for cells in the assembly and transmitting out power generated by the assembly. A solar power system connects a number of power generation assemblies in series and/or parallel via output cables in the junction boxes of the assemblies as well as connectors to realize power generation in high power, and provide power for users or connects the grid to supply power through power accumulation or inversion.

Principle of bypass protection of cells provided by junction box: The solar power generation assemblies in a solar power station system generate power under normal irradiation of sunlight and output electric energy, but when the sunlight irradiating a location of a power generation assembly is blocked by an object or a shadow of an object, the state of the silicon cell at this location will be changed from a power generation state into a resistance state. Other power generation assemblies connected to the silicon cell in series generate power normally under irradiation of sunlight and current passing the cell in a resistance state will generate large heat, burning down the cell and backing sheet of the assembly. This phenomenon is called hot spots of assemblies. In order to prevent hot spots, a bypass diode is reversely connected in parallel with each silicon cell pack in solar power generation assemblies. When conditions for hot spots appear, the diode is connected in a normal direction and current is output via the bypass diode, thereby protecting the silicon cells from burn-down and the safety of the power generation assembly.

Bypass diodes are designed to be installed inside a junction box. Currently, three bypass diodes are typically installed in a common junction box, and each of them provides bypass protection for one third of the cells in the solar power generation assembly. Therefore, junction boxes for solar power generation assemblies simultaneously have functions of bypass protection and power output.

Over the years, junction boxes have undergone multiple improvements and developments.

A junction box made in the known art typically comprises an individual diode packaging device, a junction box body (box body and box cover), internal copper conducting heat sinks (copper conductors), output cables and connectors. Diodes are assembled by means of buckling or surface-mounted diodes are used, which are assembled by means of reflow soldering to copper conducting heat sinks inside the junction box; and the copper conducting heat sinks assembled with the diodes are installed inside the junction box body by means of hot riveting of plastics. Therefore, the manufacturing and installation processes of the junction box have many steps and are labor consuming.

There is a high access threshold to manufacturing and sale of junction boxes. Currently, IEC-61215 standard is executed. Junction boxes produced in the known art meet with difficulty in solving problems about sealing performance, temperature rise and internal gas expansion.

In the current market, there are many photovoltaic module products packaged with a plurality of diode chips.

The solution is to integrate three diode chips into an injection molding body. It can simplify the process steps of diode soldering and assembly of the junction box manufacturer. However, in terms of structure and application requirements, the module is fixed inside a junction box still by mounting method, sealant still needs to be filled in the inner chamber of the box body after the solar power assembly manufacturer installs the junction box into a power generation assembly, and the product does not have obvious advantages in production and application.

Due to the impact of structure and process on the photovoltaic module, a large packaging volume and different materials, materials will be expanded in case of changes of temperature, generating a stress on the chips and affecting the service life of the product to some extent.

The photovoltaic bypass diode module is fixed and connected to the junction box body via a plastic tray in a buckled manner. As a result, the limited heat dissipation space inside the junction box cannot be effectively utilized, thus limiting the passing capacity of working current. Complex production equipment is required in the production and application of junction boxes to achieve automatic assembly.

Photovoltaic module products have the following defects in actual production and application:

1. Most photovoltaic module products adopt an ultrasonic aluminum wire wedge bonding process as shown in FIG. 35. An ultrasonic bonding tool 10 is used to connect aluminum wires to diode chips and photovoltaic modules. This method has two problems. The first, all photovoltaic diodes adopt Schottky process chips. PN junction of a diode in this process is located under a surface aluminum metal layer of the chip. The ultrasonic bonding stress will act on the diode chip. If the pressure and amplitude are large, it is prone to damaging the PN junction and affecting the service life of the product, while if they are small, it is prone to false connection. Therefore, very expensive process equipment needs to be used to meet process requirements and realize stability; the second, as aluminum wires are used as a welding material and inferior to copper and silver in terms of electric conductivity and thermal conductivity, the voltage drop of the photovoltaic module product is high and during work, the photovoltaic module product shows high heat generation, large power consumption and poor heat dissipation.

2. A process of high pressure injection is adopted, as shown in FIG. 36, to wrap a thermosetting resin material around a soldered chip. In this injection process, plastics driven by injection head is sprayed at an extremely high jet speed and pressure into the mold cavity, and directly acts upon the diode chip and the connecting aluminum strip, resulting in a compressive stress of the chip and a pull stress of the aluminum strip from the resin material. The stress concentration in the injection molding process causes deformation of the internal structure of the module, impairing the reliability of the module.

3. As a common practice among existing photovoltaic module products, three diode chips are distributed on one side of a copper conductor and this side is sealed with a thermosetting resin material. When a hot spot effect is locally generated in a photovoltaic assembly, one or two of the chips will start working to generate heat. Owing to the thermal conductivity of the external packaging material and the copper conductor, temperature of heated chips will be quickly transferred to adjacent chips to raise temperature of the adjacent chips. On the moment, the local area of the photovoltaic assembly without a hot spot effect still generates power normally and its power generation voltage reversely acts on the corresponding diode chips. Based on the high temperature characteristics of the Schottky diode chips, the reverse leak current will increase. As the leak current will not be saturated, temperature of the PN junction of the chips will rise further. Hence the reverse leak current increases again, forming a vicious cycle of heat generation of the diode chips. In a serious case, the balance point is exceeded, the diode chips are broken down, and the photovoltaic module product loses effect.

4. In an existing photovoltaic module product, diode chips are put together and wrapped with thermosetting resin. In a working state, heat generated by the diode chips cannot be dissipated fast, restricting the working current of the junction box.

5. Junction boxes produced in the known art all have a process of secondary machining of semiconductors: an individually packaged diode needs to be connected to a copper conductor by means of crimping or reflow soldering; a photovoltaic module needs to be fixed and connected to a plastic tray inside a junction box body by means of push mounting; high temperature of reflow soldering causes various expansions of different materials, which will affect internal stress and compactness of devices; crimpling will make the devices be affected by external pressure, causing plastic burst and cracking of the photovoltaic module and potential quality hazard from pressure;

6. Photovoltaic modules need high development cost and the corresponding relations with junction boxes are singular, unable to adapt to the development of j unction boxes. The requirements for installation match between the two are high, adding difficulty of development match between them.

SUMMARY

An aspect relates to a low-pressure chip packaging type junction box for a solar power generation assembly and a processing method thereof, which can solve problems of large stress, high local temperature and uneven heat dissipation of the photovoltaic module, a low utilization rate of the internal heat dissipation space of the junction box and large investment in product development, integrate techniques relating to development and manufacturing of junction boxes with semiconductor packaging techniques to effectively enhance product performance and meanwhile reduce product cost and development cost and increase a degree of product automation.

A technical solution of embodiments of the present invention: The low-pressure chip packaging type junction box for a solar power generation assembly comprises a box body, N chips, N connection members, and N+1 copper conductors, where N≥1, At least one accommodation recess is arranged at the box body, and a transverse bar with a top surface higher than a bottom of the accommodation recess is arranged on the box body;

N of the N+1 copper conductors correspond to the N chips one to one, chip installation positions are arranged at N copper conductors, and the N+1 copper conductors are provided with lead-out positions positioned at a top surface of the transverse bar;

The chips are soldered and fixed to the installation positions at the copper conductors and are connected to connection positions of adjacent copper conductors via connection members;

The N+1 copper conductors are connected in series by means of the chips and the connection members and form a bypass circuit with an output end;

The installation positions at the copper conductors, the chips and the connection members are potted, fixed and packaged within the accommodation recess by means of a potting adhesive, and the lead-out positions of the copper conductors are located above the transverse bar and higher than a top surface of the potting adhesive.

A process connecting strip is arranged between adjacent copper conductors.

When N>1, a process connection ring is arranged between at least two copper conductors.

When N>1, connection positions connecting the output end are further arranged on the first and the last copper conductors.

When N>2, the chips are arranged on two sides of the transverse bar respectively.

Busbar guide holes are arranged on the transverse bar and run through the transverse bar from a back face of the box body; the lower openings of the busbar guide holes are large and the upper openings are small;

Threading holes corresponding to the busbar through holes are arranged on the lead-out positions of the copper conductors.

The processing method of a low-pressure chip packaging type junction box for a solar power generation assembly comprises the following steps:

1). Processing of copper conductors: punching copper sheets to form a copper conductor frame where adjacent copper conductors are connected into a body via a process connecting structure and there is a clearance between them;

2). Chip connection: soldering chips onto the copper conductors via connection members to form a copper conductor frame having a bypass circuit structure;

3). Packaging: putting the copper conductor framework at the foregoing step into the box body, potting an epoxy resin adhesive into the accommodation recess to package the chips and the connection members inside the epoxy resin adhesive and curing the epoxy resin adhesive; and 4). Cutting: cutting off the process connecting structure to obtain a low-pressure chip packaging type junction box for a solar power generation assembly.

The process connecting structure at step 1) is a process connecting strip, which is located on a transverse bar, At step 4), process connecting strips between adjacent copper conductors are cut off by blanking machine.

The process connecting structure at step 1) is a process connection ring;

At step 3), a positioning stud is arranged in the accommodation recess of the box body, which is inside the process connection ring, and a conical blind hole consistent with the centerline of the positioning stud is arranged on the bottom surface of the box body;

At step 4), the process connection ring between adjacent copper conductors is removed through drilling and passing through the conical blind hole.

A heat sink is further comprised, which is packaged inside epoxy resin adhesive.

The embodiments design the box body of the junction box into a plastic body having one or more adhesive storage slot with an opening top (i.e., accommodation recess); and determines the number of accommodation recesses according to the requirements of the junction box model and the requirements of heat dissipation distribution. For a box body having two or more accommodation recesses, the accommodation recesses are arranged in two lines, a transverse bar is arranged between two lines of accommodation recesses, busbar guide holes are arranged on the transverse bar, and threading holes are arranged on lead-out positions of copper conductors so as to place a busbar according to user's application. This distribution mode enables dispersion of heat sources during work of diodes, makes full use of the limited heat dissipation space in the junction box and reduces mutual impact.

In embodiments of the present invention, chip installation positions are arranged on copper conductors and lead-out positions are arranged at a top surface of a transverse bar so that local copper conductors carrying diode chips by means of soldering sink through bending to enable the chips and partial copper conductors to be inlaid in corresponding accommodation recesses. Then epoxy resin adhesive with high thermal conductivity and high mechanical strength is potted into the accommodation recesses. After curing, the diode chips are sealed for protection, and the copper conductors are also fixed to the junction box body to form a junction box;

The embodiments use an epoxy resin adhesive with high thermal conductivity and high mechanical strength. Through potting at a low pressure and static curing, the diode chips are packaged for protection and the copper conductors and the box body are fixed in high strength. The production process avoids mechanical impact of jet flow of a high-pressure injection molding material on chips, and pull of the chips resulting from deformation of copper conductors caused by the jet flow of a high-pressure injection molding material;

In embodiments of the present invention, the copper conductors not only provide a circuit passage for the junction box, more importantly, provide a condition for heat dissipation of diode chips, the copper conductors sink by means of bending to increase an unfolding area and provide a more sufficient heat dissipation condition for the work of diode chips;

Meanwhile, after epoxy resin filled with alumina powder, silica powder or other thermally conductive media in accommodation recesses is cured, the epoxy resin fully contacts the copper conductors in a horizontal direction and a vertical direction to quickly lower working temperature of the chips, improve current passing capacity by 30% and more efficiently raise product performance of the junction box.

N+1 copper conductors are connected in series by means of the chips and the connection members. In order to eliminate a pull stress on the chips resulting from relative movement of the copper conductors in the manufacturing process, embodiments of the present invention designs process connection rings or process connecting strips among copper conductors during punching of the copper conductors so that a plurality of copper conductors temporarily forms an integral body. After chip soldering, potting and curing, the process connection rings or process connecting strips are removed by means of drilling or punching.

The embodiments step over a packaging and manufacturing process of individually packaged diode junction boxes and photovoltaic module junction boxes, and skips work content such as secondary soldering and secondary assembly. The embodiments integrate design and manufacturing of junction boxes with semiconductor diode packaging techniques and avoids potential quality hazard of junction box products arising from secondary soldering and installation; greatly raises development speed of junction boxes; saves the processes of mutual running-in and adjustment of the junction box manufacturer and the semiconductor diode packaging manufacturing; and facilitates a more compact structure of the junction box products, more reasonable use of materials, faster development of products, easier realization of automated production, lower product manufacturing cost and stronger market competitiveness.

BRIEF DESCRIPTION

Some of the embodiments will be described in detail, with references to the following Figures, wherein like designations denote like members, wherein:

FIG. 1 is a structural schematic view of a first embodiment of the present invention;

FIG. 2 is a structural schematic view of a box body in FIG. 1;

FIG. 3 is an A-A section view of FIG. 2;

FIG. 32 is a structural schematic view 1 of a lead-out end of the box body in FIG. 27;

FIG. 33 is a structural schematic view 2 of a lead-out end of the box body in FIG. 27;

FIG. 34 is a structural schematic view for connection between a copper conductor frame and chips in FIG. 27;

Figure 4:
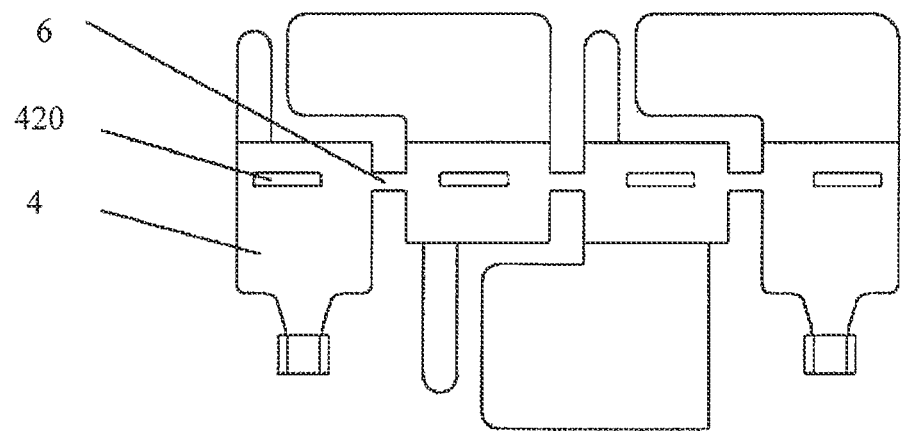
FIG. 4 is a structural schematic view of a copper conductor frame in FIG. 1.
Figure 5:
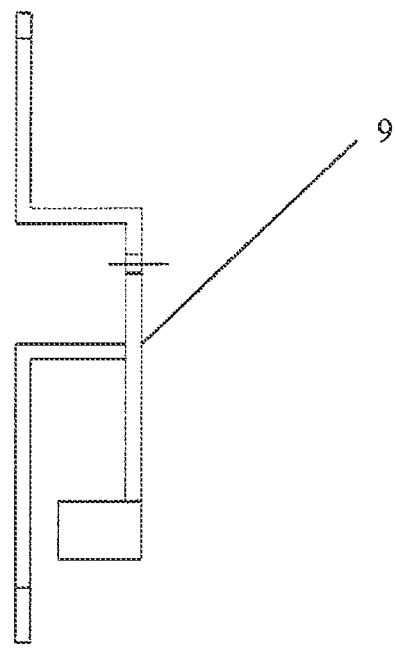
FIG. 5 is a left view of FIG. 4.
Figure 6:
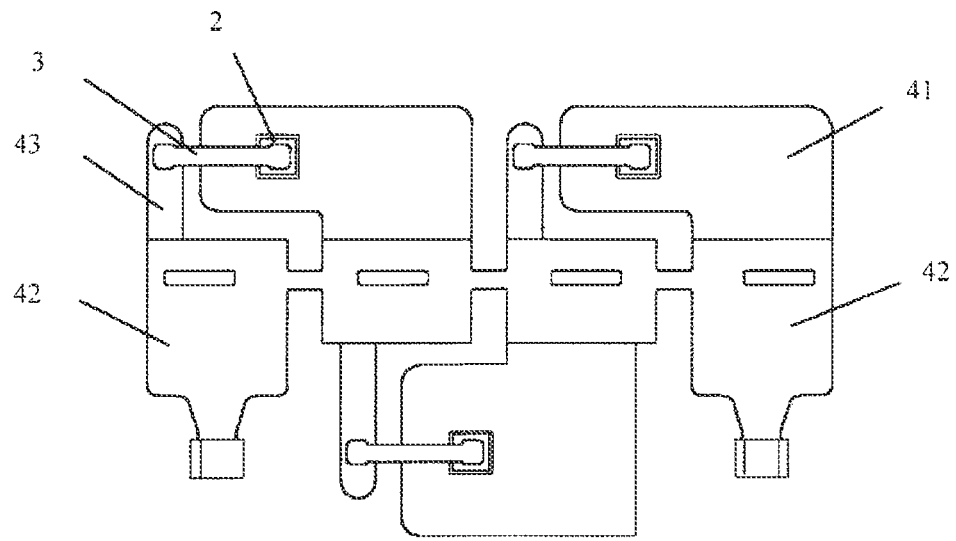
FIG. 6 is a structural schematic view for connection between a copper conductor frame and chips in FIG. 1.
Figure 7:
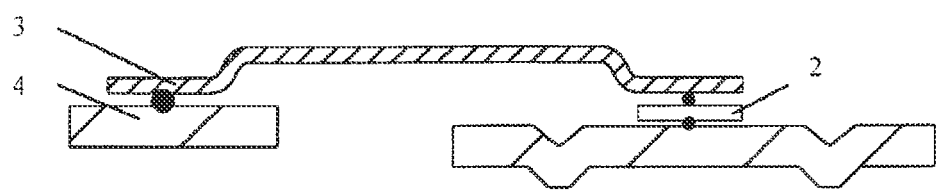
FIG. 7 is a structural schematic view for connection between copper conductors and chips in FIG. 1.
Figure 8:
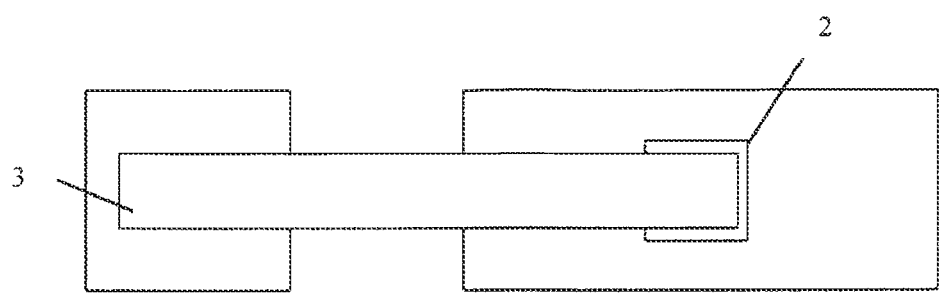
FIG. 8 is a top view of FIG. 7.
Figure 9:
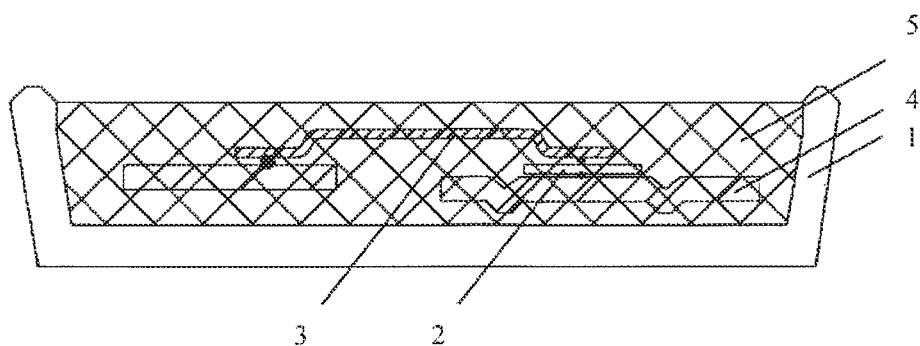
FIG. 9 is a structural schematic view for potting in a box body in embodiments of the present invention.
Figure 10:
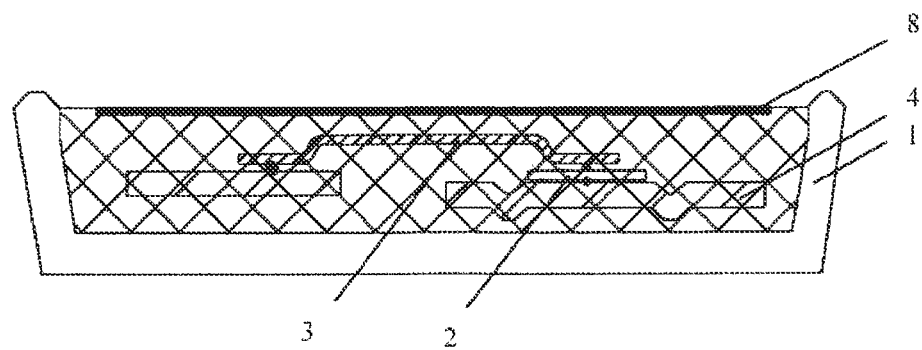
FIG. 10 is a structural schematic view of embodiments of the present invention.
Figure 11:
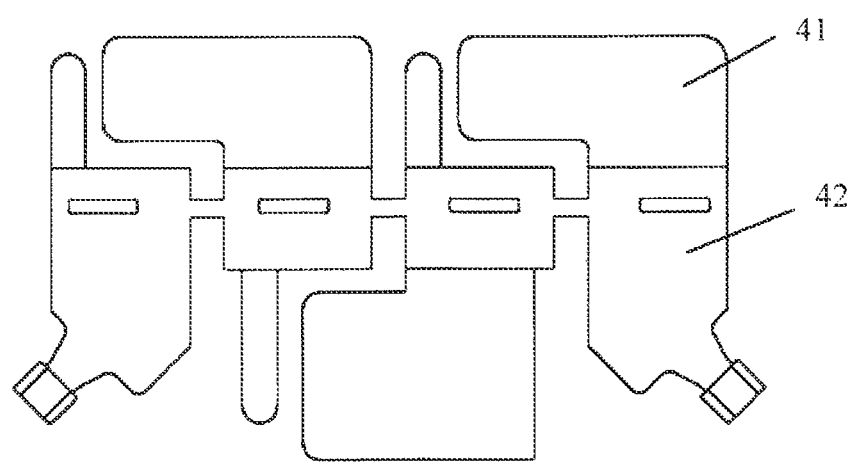
FIG. 11 is a structural schematic view 1 of a lead-out end of the box body in FIG. 1.
Figure 12:
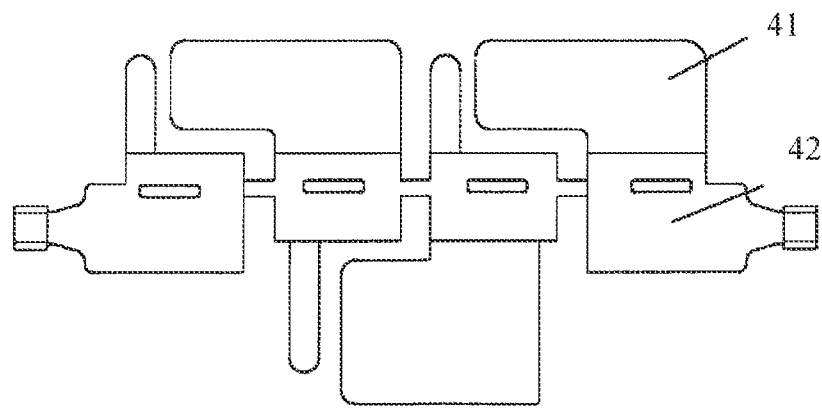
FIG. 12 is a structural schematic view 2 of a lead-out end of the box body in FIG. 1.

In the figures, 1 denotes a box body, 11 denotes an accommodation recess, 12 denotes a transverse bar, 120 denotes a busbar guide hole, 13 denotes a positioning stud, 14 denotes a conical blind hole, 2 denotes a chip, 3 denotes a connection member, 4 denotes a copper conductor, 41 denotes an installation hole, 42 denotes a lead-out position, 420 denotes a threading hole, 43 denotes a connection position, 5 denotes a potting adhesive, 6 denotes a process connecting strip, 7 denotes a process connection ring, 8 denotes a heat sink, 9 denotes a copper conductor frame, and 10 denotes an ultrasonic bonding tool.

DETAILED DESCRIPTION

The embodiments, as shown in FIGS. 1-34, comprise a box body 1, N chips 2, N connection members 3 and N+1 copper conductors 4, with N≥1. At least one accommodation recess 11 is arranged at the box body, and a transverse bar 12 with a top surface higher than a bottom of the accommodation recess is arranged on the box body;

The shape of the accommodation recess can be designed to be square, oval or polygonal depending on product requirements;

Distribution of the accommodation recesses in a junction box: When the junction box has one accommodation recess, the accommodation recess is distributed on one side of the junction box; when the junction box has two or more accommodation recesses, the accommodation recesses are distributed on two sides or periphery of the junction box; the purpose is to maximally disperse heat sources and make use of limited heat dissipation space of the junction box;

N of the N+1 copper conductors 4 correspond to the N chips one to one. Chip installation positions 41 are arranged at N copper conductors. The N+1 copper conductors are provided with lead-out positions 42 positioned at a top surface of the transverse bar so that the copper conductors have at least two planes with unequal heights;

In this way, sinking locations of diode chips and copper conductors in the copper conductors soldered with diode chips are inlaid in the accommodation recesses of the box body, and are sealed and fixed inside the box body through potting of an epoxy resin adhesive with high thermal conductivity and high mechanical strength;

In each accommodation recess, one or more chips can be inlaid, sealed and fixed; and sinking locations of two or more cooper conductors can be inlaid and sealed; for a copper conductor having a plurality of sinking locations, sinking locations are inlaid in different accommodation recesses in the junction box respectively.

Sinking copper conductors are made of red copper, brass or alloy copper through punching and bending. The lower plane after bending is a sinking location. Each copper conductor has one or more sinking location; the sinking locations are distributed on one side or a few sides or at a middle position of the copper conductor.

Figure 13:
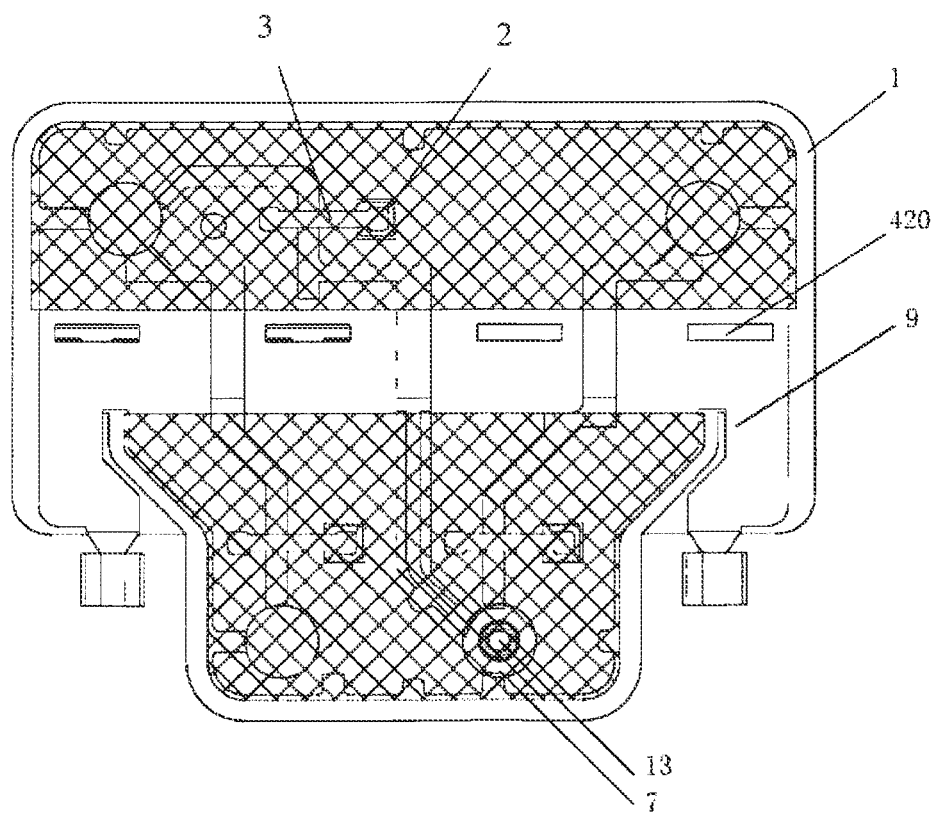
FIG. 13 is a structural schematic view of a second embodiment of the present invention.
Figures 14, 15:
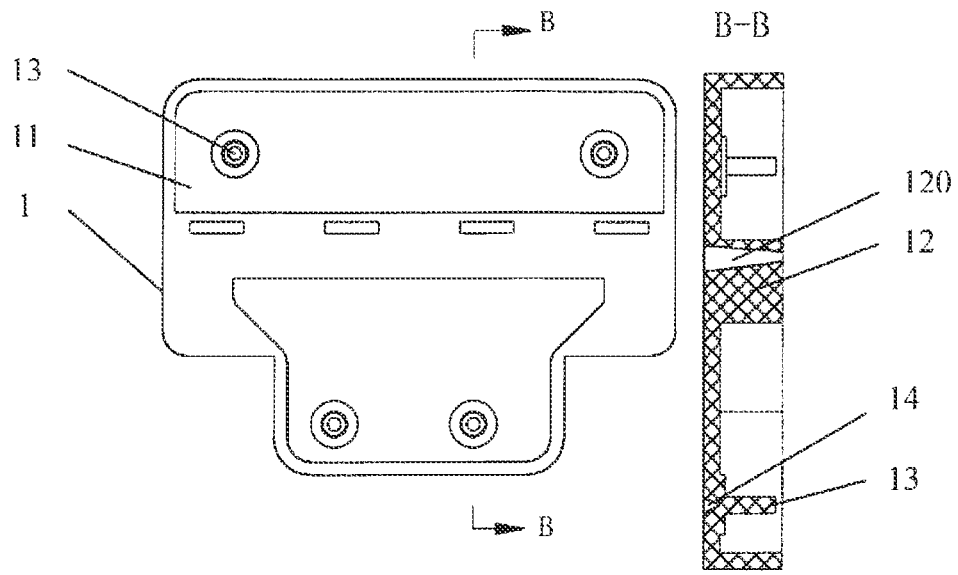
FIG. 14 is a structural schematic view of a box body in FIG. 13.
FIG. 15 is a B-B section view of FIG. 14.
Figures 16, 17:
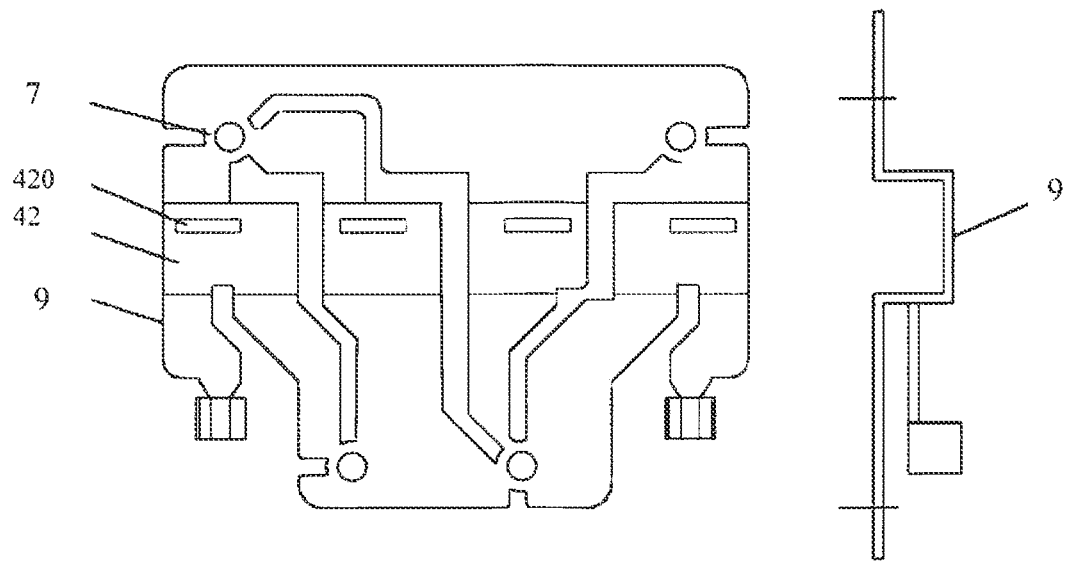
FIG. 16 is a structural schematic view of a copper conductor frame in FIG. 13.
FIG. 17 is a left view of FIG. 16.
Figure 18:
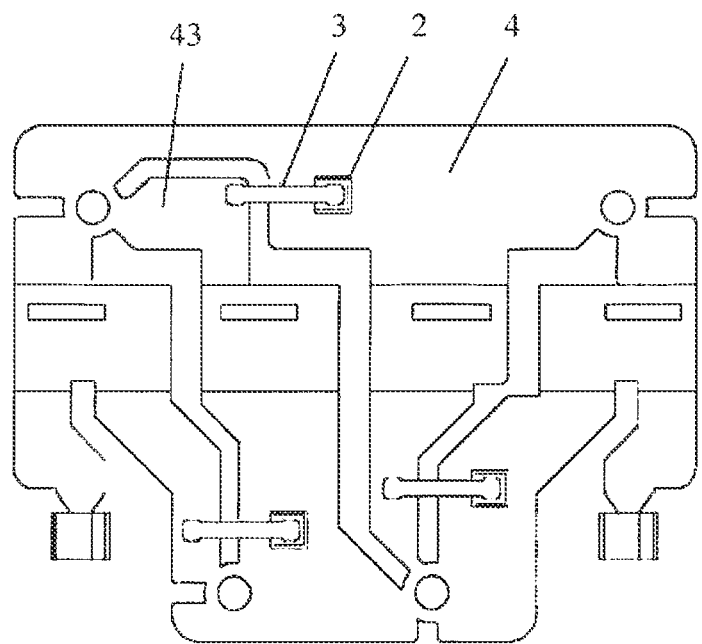
FIG. 18 is a structural schematic view for connection between copper conductors and chips in FIG. 13.
Figure 19:
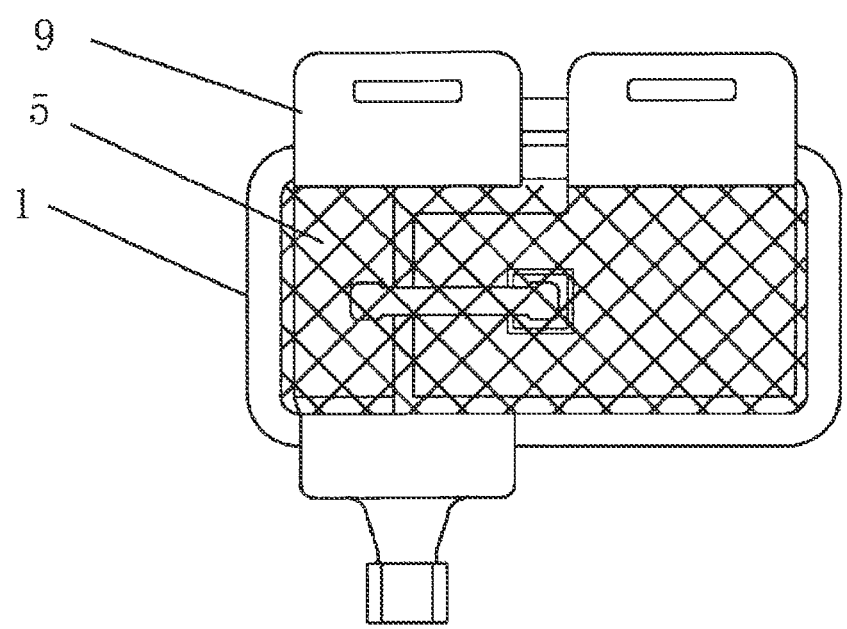
FIG. 19 is a structural schematic view of a third embodiment of the present invention.
Figure 21:
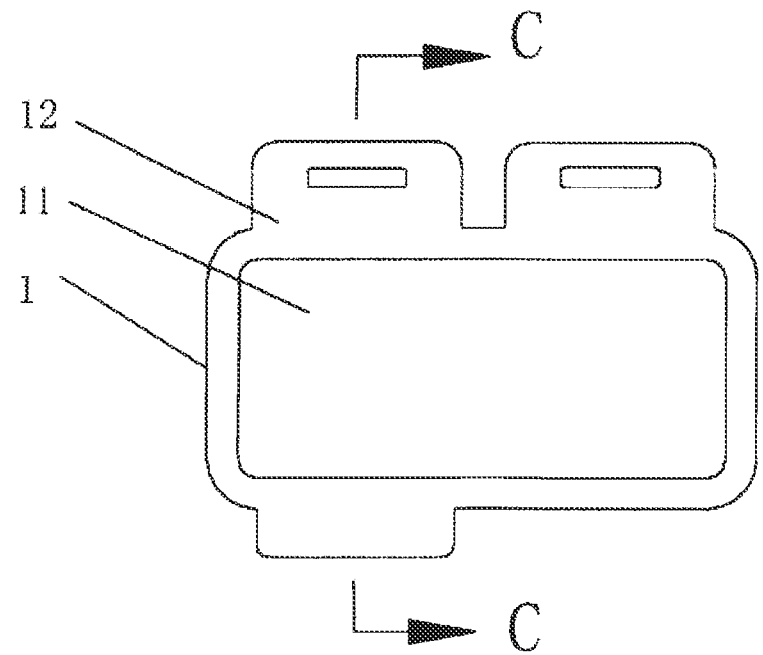
FIG. 21 is a C-C section view of FIG. 20.
Figure 20:
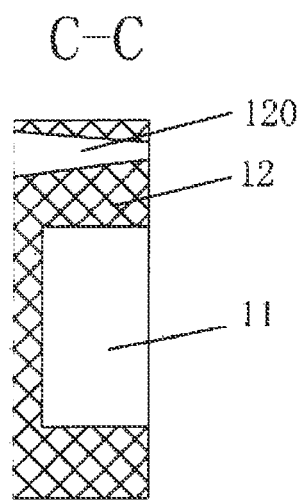
FIG. 20 is a structural schematic view of a box body in FIG. 19.
Figure 22:
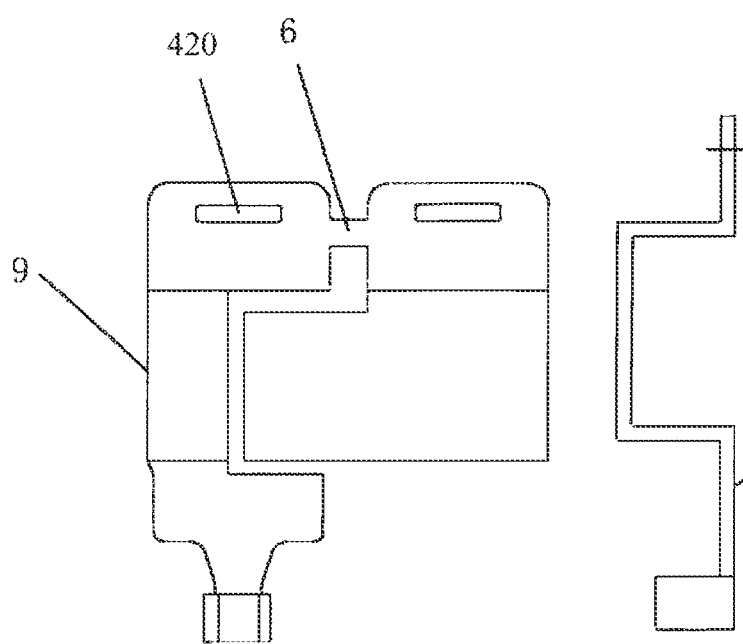
FIG. 22 is a structural schematic view of a copper conductor frame in FIG. 19.
Figure 23:
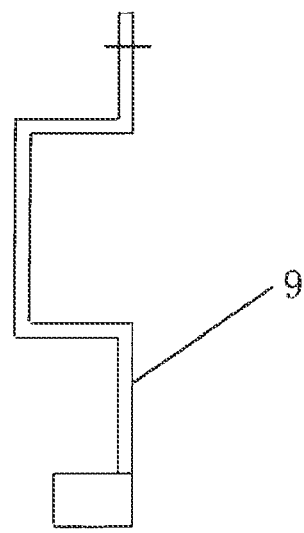
FIG. 23 is a left view of FIG. 22.
Figure 24:
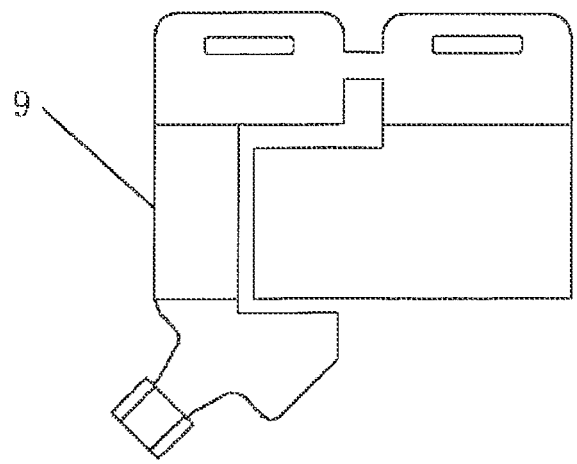
FIG. 24 is a structural schematic view 1 of a lead-out end of the box body in FIG. 19.
Figure 25:
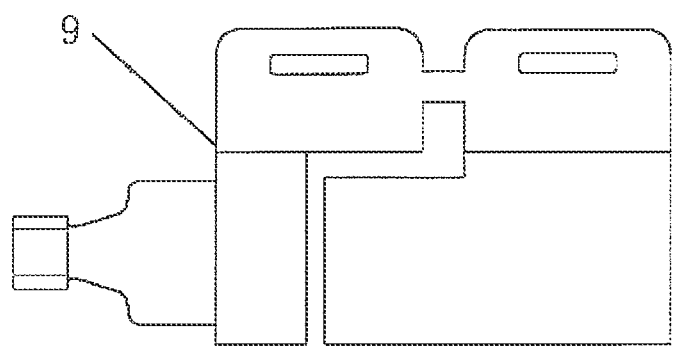
FIG. 25 is a structural schematic view 2 of a lead-out end of the box body in FIG. 19.
Figure 26:
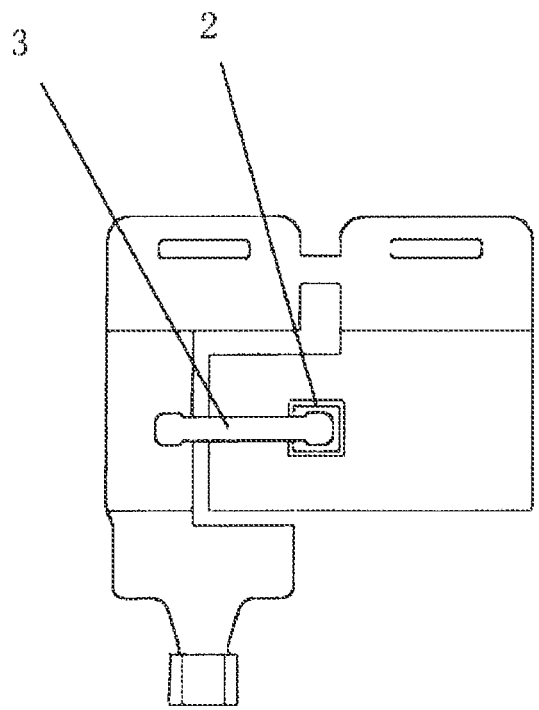
FIG. 26 is a structural schematic view for connection between a copper conductor frame and chips in FIG. 19.
Figure 27:
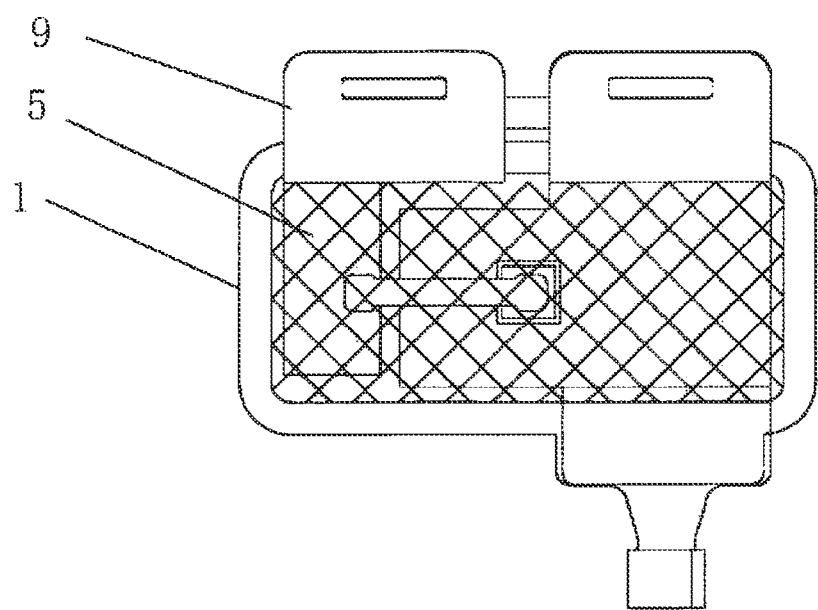
FIG. 27 is a structural schematic view of a fourth embodiment of the present invention.
Figures 28, 29:
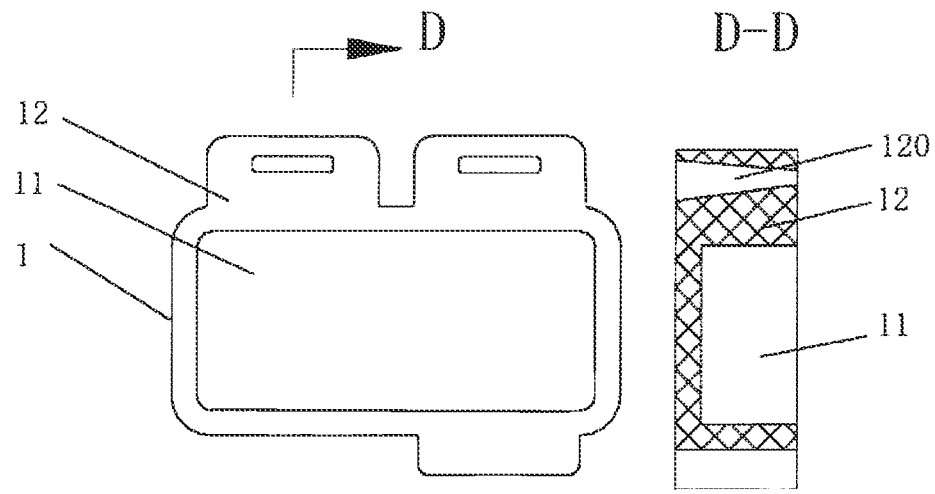
FIG. 28 is a structural schematic view of a box body in FIG. 27.
FIG. 29 is a D-D section view of FIG. 28.
Figures 30, 31:
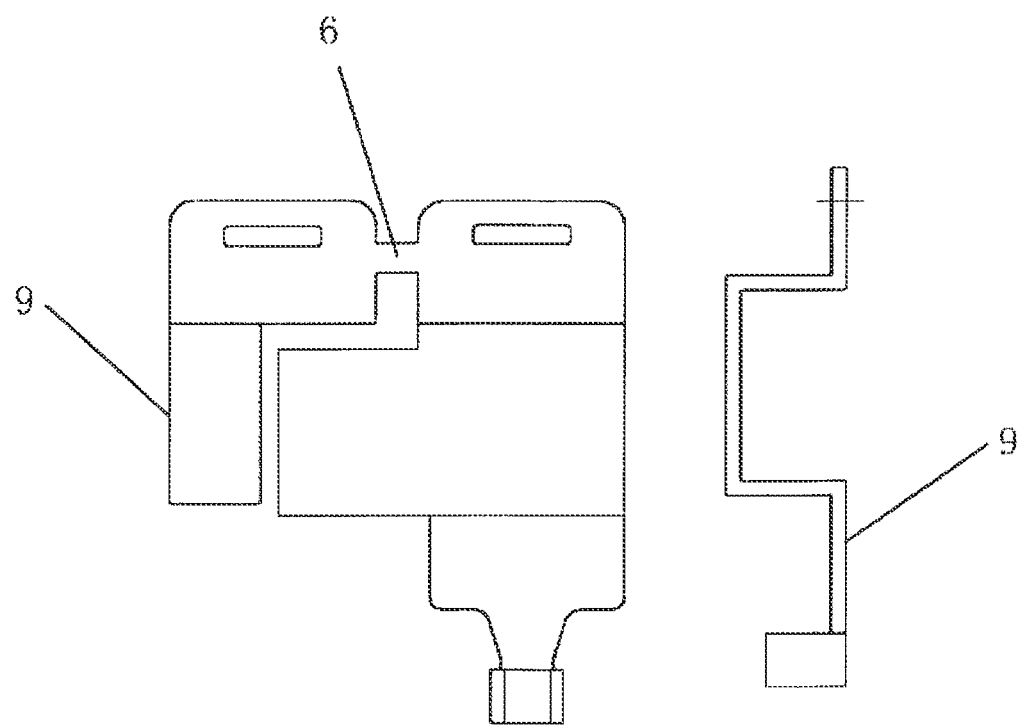
FIG. 30 is a structural schematic view of a copper conductor frame in FIG. 27.
FIG. 31 is a left view of FIG. 30.
Figure 35:
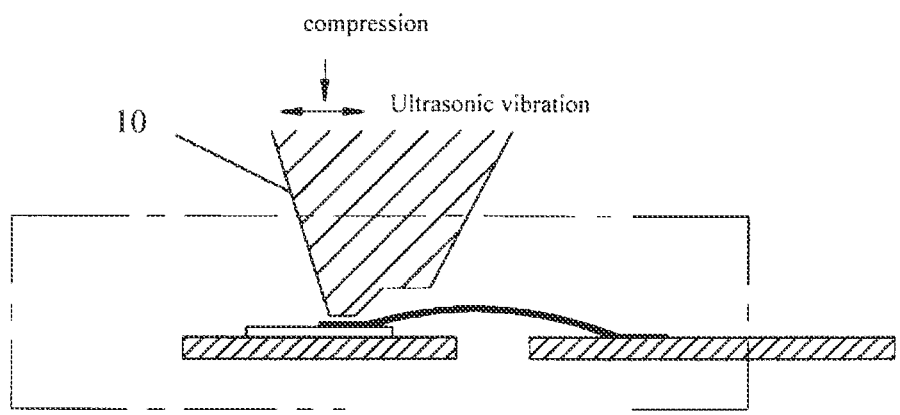
FIG. 35 is a structural schematic view of ultrasonic aluminum wire wedge bonding in the known art.
Figure 36:
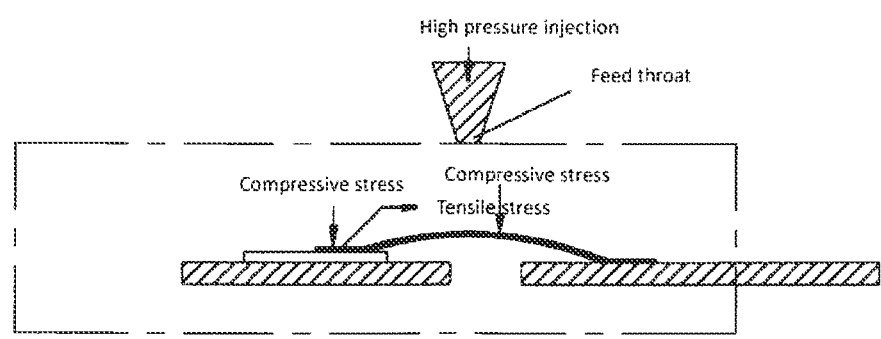
FIG. 36 is a structural schematic view of a high-pressure injection process in the known art.

As shown in FIG. 19 and FIG. 27, when there is only one chip, chip installation positions are arranged on one of the two copper conductors, and lead-out positions are arranged on both of the copper conductors;

As shown in FIG. 1 and FIG. 13, when there are three chips, chip installation positions are arranged on three of the four copper conductors, and lead-out positions are arranged on all of the four copper conductors;

The chips are soldered on the installation positions of the copper conductors in a fixed manner and are connected to connection positions 43 of adjacent copper conductors via connection members;

The N+1 copper conductors are connected in series by means of the chips and the connection members and form a bypass circuit with an output end; N surface of a diode chip in the junction box is soldered on a copper conductor, P of the diode chip is connected to an adjacent copper conductor in a jumping manner by means of soldered connection members, realizing series connection, and copper conductors are used as nodes for customer's soldering of a busbar and connection of output cables.

When N=1, one node is formed; or when N>1, N+1 nodes are formed;

The installation positions at the copper conductors, the chips and the connection members are potted, fixed and packaged within the accommodation recess by means of a potting adhesive 5, and the lead-out positions of the copper conductors are located above the transverse bar and higher than a top surface of the potting adhesive.

A process connecting strip 6 is arranged between adjacent copper conductors so that a plurality of copper conductors temporarily forms an integral body to eliminate a pull stress on the chips resulting from relative movement of the copper conductors in the manufacturing process.

When N>1, a process connection ring 7 is arranged between at least two copper conductors so that a plurality of copper conductors temporarily forms an integral body to eliminate a pull stress on the chips resulting from relative movement of the copper conductors in the manufacturing process.

When N>1, connection positions connecting the output end are further arranged on the first and the last copper conductors. When N=1, a connection position connecting the output end is arranged on one copper conductor; and typically, when there is only one chip, a combined use is needed.

A clearance is arranged between copper conductors, which are electrically connected by means of chips and connection members, wherein the first copper conductor has an anode cable lead-out end and the last copper conductor has a cathode cable lead-out end, and the anode cable lead-out end and the cathode cable lead-out end are both arranged outside the box body;

The anode cable lead-out end and the cathode cable lead-out end are set to be perpendicular to the box body;

The anode cable lead-out end and the cathode cable lead-out end are set to be in parallel with the box body;

The anode cable lead-out end and the cathode cable lead-out end are set to be at any angle with the box body;

When N>2, the chips are arranged on two sides of the transverse bar respectively. This distribution mode enables dispersion of heat sources during work of diodes, makes full use of the limited heat dissipation space in the junction box and reduces mutual impact.

Busbar guide holes 120 are arranged on the transverse bar 12 and run through the transverse bar from a back face of the box body; and the lower openings of the busbar guide holes are large and the upper openings are small to play a guiding role and facilitate placement of a busbar;

Threading holes 420 corresponding to the busbar guide holes are arranged on the lead-out positions 42 of the copper conductors.

Threading holes and solder pads for customer's installation and soldering of a busbar are arranged on upper-layer stepped planes (i.e. lead-out positions) of sinking copper conductors; for copper conductors with one sinking location, threading holes and solder pads for customer's installation and soldering of a busbar are arranged on one side of the copper conductors; for copper conductors with two or more sinking locations, threading holes and solder pads for customer's installation and soldering of a busbar are arranged in the middle of the copper conductors.

The processing method of a low-pressure chip packaging type junction box for a solar power generation assembly comprises the following steps:

1). Processing of copper conductors: punching copper sheets to form a copper conductor frame 9 where adjacent copper conductors are connected into a body via a process connecting structure and there is a clearance between them;
Process connection rings or process connecting strips are arranged among copper conductors so that the copper conductors temporarily form an integral body. After chip soldering, potting and curing, the process connection rings or process connecting strips are removed;

2). Chip connection: soldering chips onto the copper conductors via connection members to form a copper conductor frame having a bypass circuit structure;

3). Packaging: putting the copper conductor framework at the foregoing step into the box body, potting an epoxy resin adhesive into the accommodation recess to package the chips and the connection members inside the epoxy resin adhesive and curing the epoxy resin adhesive; and 4). Cutting: cutting off the process connecting structure to obtain a low-pressure chip packaging type junction box for a solar power generation assembly.

The process connecting structure at step 1) is a process connecting strip, which is located on a transverse bar and connected between lead-out positions of adjacent conductors, At step 4), process connecting strips between adjacent copper conductors are cut off by blanking machine.

The embodiments reserve a space on the transverse bar of the box body to punch and remove connecting strips after curing of epoxy resin in the accommodation recess.

The process connecting structure at step 1) is a process connection ring;

At step 3), a positioning stud 13 is arranged in the accommodation recess of the box body, which is inside the process connection ring, and a conical blind hole 14 consistent with the centerline of the positioning stud is arranged on the bottom surface of the box body;

At step 4), the process connection ring between adjacent copper conductors is removed through drilling and passing through the conical blind hole.

The embodiments arrange positioning studs matched with process connection rings of copper conductors inside accommodation recesses of the box body, and arranges conical blind holes corresponding to the positioning studs on a back face of the box body to play a guiding role to accurately remove the process connection rings by means of drilling.

A heat sink 8 is further comprised, which is packaged inside an epoxy resin adhesive, plays a heat sinking effect and can be made of copper sheets or aluminum sheets, etc.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A low-pressure chip packaging type junction box for a solar power generation assembly, comprising a box body, N chips, N connection members and N+1 copper conductors, with N≥1, comprising:
   at least one accommodation recess is arranged at the box body; and
   a transverse bar with a top surface higher than a bottom surface of the accommodation recess arranged on the box body;
   wherein N of the N+1 copper conductors correspond to the N chips one to one;
   wherein chip installation positions are arranged at N copper conductors, and the N+1 copper conductors are provided with lead-out positions positioned at a top surface of the transverse bar, the N chips being soldered and fixed to the chip installation positions at the N+1 copper conductors and are connected to connection positions of adjacent copper conductors via connection members;
   wherein the N+1 copper conductors are connected in series by the N chips and the connection members, and form a bypass circuit with an output end;
   wherein the chip installation positions at the N+1 copper conductors, the N chips and the connection members are potted, fixed and packaged within the accommodation recess by a potting adhesive, and the lead-out positions of the N+1 copper conductors are located above the transverse bar and higher than a top surface of the potting adhesive;
   wherein busbar guide holes are arranged on the transverse bar and run through the transverse bar from a back face of the box body, and lower portions of the busbar guide holes at the back face of the box body are larger than upper portions of the busbar guide holes; and
   wherein threading holes corresponding to the busbar guide holes are arranged on the lead-out positions of the N+1 copper conductors.

2. The low-pressure chip packaging type junction box for a solar power generation assembly according to claim 1, wherein a process connecting strip is arranged between adjacent copper conductors.

3. The low-pressure chip packaging type junction box for a solar power generation assembly according to claim 1, wherein when N>1, a process connection ring is arranged between at least two copper conductors.

4. The low-pressure chip packaging type junction box for a solar power generation assembly according to claim 1, wherein when N>1, connection positions connecting the output end are further arranged on the first and the last copper conductors.

5. The low-pressure chip packaging type junction box for a solar power generation assembly according to claim 1, wherein when N>2, the N chips are arranged on two sides of the transverse bar, respectively.

\* \* \* \* \*